United States Patent [19]

Takano

[11] Patent Number: 6,075,738
[45] Date of Patent: Jun. 13, 2000

[54] SEMICONDUCTOR MEMORY DEVICE

[75] Inventor: Yoh Takano, Gifu-ken, Japan

[73] Assignee: Sanyo Electric Co., Ltd., Osaka, Japan

[21] Appl. No.: 09/030,302

[22] Filed: Feb. 25, 1998

[30] Foreign Application Priority Data

Feb. 27, 1997 [JP] Japan .................................. 9-043972
Mar. 27, 1997 [JP] Japan .................................. 9-076148

[51] Int. Cl.$^7$ .................................................. G11C 13/00
[52] U.S. Cl. ..................................... 365/210; 365/189.01
[58] Field of Search ........................ 365/189.01, 230.01, 365/210, 208

[56] References Cited

U.S. PATENT DOCUMENTS 5,029,130  7/1991  Yeh ............................................. 365/185
5,473,568 12/1995  Okamura ................................... 365/210

FOREIGN PATENT DOCUMENTS

WO92/18980 10/1992 WIPO .

*Primary Examiner*—Terrell W. Fears
*Attorney, Agent, or Firm*—Sheridan Ross P.C.

[57] ABSTRACT

A flash EEPROM has a memory cell array of memory cells. Each memory cell includes a floating gate electrode, a source, a drain and a control gate electrode. A data value is stored in a memory cell by storing a charge in its floating gate electrode. A control circuit controls voltages applied to the control gate electrode, the source and the drain of the memory cells. A charge which is greater than a charge amount corresponding to a desired data value is stored in the floating gate electrode of a memory cell. In the write mode, charge is drained from the floating gate electrode. A write determining circuit checks the amount of charge remaining in the floating gate electrode after charge has been drained from it. The write determining circuit disables the write operation when the amount of charge remaining in the floating gate electrode reaches the charge amount corresponding to the desired data value.

18 Claims, 15 Drawing Sheets

Fig.3 (Prior Art)

| Operation modes | Write | Erase | Read |
|---|---|---|---|
| Word line WLm (Control gate CG) | 1V | 15V | 4V |
| Bit line BLm (Drain D) | 12V | 0V | 3V |
| Common source line SL (Source S) | 0V | 0V | 0V |
| Substrate 102 | 0V | 0V | 0V |

Fig.4 (Prior Art)

| Operation modes | Write | Erase | Read |
|---|---|---|---|
| Word line WLm (Control gate CG) | 1V | 15V | 4V |
| Bit line BLm (Drain D) | 0V | 0V | 3V |
| Common source line SL (Source S) | 12V | 0V | 0V |
| Substrate 102 | 0V | 0V | 0V |

Fig.8

| Operation modes | Write | Erase | Read | Erase/Read |
|---|---|---|---|---|
| Word line WLm (Control gate electrode CG) | 1V | 15V | 4V | 10V |
| Bit line BLm (Drain region D) | $V_{PP}$ (9.5V, 8.1V, 7.3V, 0V) | 0V | 0V | 0V |
| Common source line SL (source region S) | 0V | 0V | 3V | 3V |
| Substrate 102 | 0V | 0V | 0V | 0V |

| Input data | | Floating gate voltage Vfg in read mode | Cell current Icell in read mode | Write voltage Vpp |
|---|---|---|---|---|
| Input of data pad 203a | Input of data pad 203b | | | |
| 0 | 0 | Va'=0.6V<br>Va'−Δ=0.3V | 0μA | 9.5V |
| 0 | 1 | Vb'=1V<br>Vb'−Δ=0.7V | 25μA | 8.1V |
| 1 | 0 | Vc'=1.5V<br>Vc'−Δ=1.2V | 55μA | 7.3V |
| 1 | 1 | Erased | Erased | 0V |

Δ=0.3V

| Output of comparison amplifier 24a | Output of comparison amplifier 24b | Output of comparison amplifier 24c | Output data | |
|---|---|---|---|---|
| | | | Output of data pad 203a | Output of data pad 203b |
| 0 | 0 | 0 | 0 | 0 |
| 1 | 0 | 0 | 0 | 1 |
| 1 | 1 | 0 | 1 | 0 |
| 1 | 1 | 1 | 1 | 1 |

Fig.18

| Operation modes | Write | Erase | Read | Erase/Read |
|---|---|---|---|---|
| Word line WLm (Control gate electrode CG) | 1V | 15V | 4V | 10V |
| Word line WLn (Control gate electrode CG) | 0V | 0V | 0V | 0V |
| Bit line BL1 (Source/Drain region SD) | 0V | 0V | 3V | 3V |
| Bit line BLm (Source/Drain region SD) | $V_{PP}$ (9.5V, 8.1V, 7.3V, 0V) | 0V | 0V | 0V |
| Bit line BLn (Source/Drain region SD) | 0V | 0V | 3V | 3V |
| Bit line BLo (Source/Drain region SD) | 0V | 0V | 3V | 3V |
| Substrate 102 | 0V | 0V | 0V | 0V |

SEMICONDUCTOR MEMORY DEVICE

BACKGROUND OF THE INVENTION

The present invention relates to a semiconductor memory device, and, more particularly, to a non-volatile semiconductor memory device including a flash EEPROM (Electrically Erasable and Programmable Read Only Memory).

Non-volatile semiconductor memories, such as a Ferro-electric Random Access Memory, EPROM (Erasable and Programmable Read Only Memory) and EEPROM are used in many types of electronic devices. The EPROM and EEPROM have a plurality of memory cells each including a floating gate for storing a charge and a control gate for detecting a change in the threshold voltage in accordance with the quantity of charge stored in the floating gate. One feature of the EEPROM is that the entire array of memory cells can be erased. The EEPROM includes a flash EEPROM, which has its memory cell array separated into a plurality of blocks. The flash EEPROM can selectively erase data block by block. The flash EEPROM has the following advantages:

(1) Non-volatile property for stored data;
(2) Low power consumption;
(3) Electrically rewritable (rewritable on board); and
(4) Low cost.

Therefore, the flash EEPROM is desirable as a memory for storing programs or data in electronic devices, such as portable telephones and portable information terminals.

In general, there are two types of memory cells in a flash EEPROM: one is a split gate type and the other is a stack gate type. International Patent Publication WO92/18980 and U.S. Pat. No. 5,029,130 disclose a split gate flash EEPROM.

FIG. 1 is a cross-sectional view schematically illustrating a conventional split gate memory cell 101 disclosed in U.S. Pat. No. 5,029,130. The split gate memory cell 101 has a source S of an N-type conductivity and a drain D of the N-type conductivity, both defined on a single crystalline silicon substrate 102 having a P-type conductivity, a floating gate FG provided on a first silicon oxide film 103 over a channel CH between the source S and drain D, and a control gate CG provided on a second silicon oxide film 104 over the floating gate FG. A part of the control gate CG is arranged as a select gate 105 on the first insulator film 103 over the channel CH, and the remaining part of the control gate CG is arranged on the second insulator film 104 over the floating gate FG.

FIG. 2 is a block diagram showing a conventional flash EEPROM 121 having a plurality of split gate memory cells 101. The flash EEPROM 121 includes a memory cell array 122, a row decoder 123, a column decoder 124, an address pad 125, an address buffer 126, an address latch 127, a data pad 128, an input buffer 129, a sense amplifier group 130, an output buffer 131 and a control core circuit 132.

The memory cell array 122 has a matrix of split gate memory cells 101, a plurality of word lines WLa to WLz each commonly connected to the control gates CG of an associated row of the memory cells 101, a plurality of bit lines BLa to BLz each commonly connected to the drains D of an associated column of the memory cells 101, and a source line SL connected to the source S all of the memory cells. The source line SL is also connected to a ground.

A row address and a column address supplied from an external unit (not shown) are supplied to the address buffer 126 via the address pad 125. The address buffer 126 transfers the row address and column address to the address latch 127. The address latch 127 latches the row and column addresses and transfers the row address to the row decoder 123 and the column address to the column decoder 124. The row decoder 123 selects one word line in accordance with the row address and controls the voltage applied to the selected word line WLm in accordance with an individual operation mode (FIG. 5). The column decoder 124 selects one bit line in accordance with the column address and controls the voltage applied to the selected bit line, also in accordance with the individual operation modes.

Data supplied from the external unit (not shown) is supplied to the input buffer 129 via the data pad 128. The input buffer 129 transfers the data to the column decoder 124. The column decoder 124 controls the voltage applied to any selected one of the bit lines BLa–BLz according to the data. Data read from an arbitrary memory cell 101 is transferred from the selected bit line to the sense amplifier group 130 via the column decoder 124. The sense amplifier group 130 includes a plurality of sense amplifiers (not shown). The column decoder 124 operates so as to connect the selected bit line to the sense amplifiers. The sense amplifier group 130 discriminates the data and supplies it to the output buffer 131. The output buffer 131 supplies the data to the data pad 128. The thus read data is supplied to an external unit via the data pad 128.

The control core circuit 132 controls the operations of the row decoder 123, the column decoder 124, the address buffer 126, the address latch 127, the input buffer 129, the sense amplifier group 130 and the output buffer 131.

The individual operation modes (erase mode, write mode and read mode) of the flash EEPROM 121 will now be discussed with reference to FIG. 3. In any one of the operation modes, a voltage of the ground level is applied to the common source line SL (i.e., the source region S of all of the memory cells 101 and the substrate 102).

(a) Erase Mode

In erase mode, a voltage of the ground level (0 V) is applied to all of the bit lines BLa–BLz. A voltage of about +15 V is applied to a selected word line WLm and a voltage of the ground level is applied to the other, non-selected word lines WLa–WLl and WLn–WLz. Data is erased from all of the memory cells 101 connected to the selected word line WLm as the electric potential of the control gates CG of those memory cells 101 are pulled up to about +15 V.

When the electric potential of the control gate CG is about +15 V and the electric potential of the drain is 0 V, a high electric field is produced between the control gate CG and the floating gate FG so that a Fowler-Nordheim (FN) tunnel current flows between the floating gate FG and the control gate CG. Consequently, electrons in the floating gate FG are pulled out to the control gate CG, resulting in data erasure. The erasing operation is based on the fact that the electrostatic capacitance between the drain D and the floating gate FG is significantly greater than that between the control gate CG and the floating gate FG. Simultaneous selection of a plurality of word lines WLa–WLz allows for data erasure of all of the memory cells 101 connected to the selected individual word lines. Such an erasure is called "block erasure".

(b) Write Mode

In write mode, a voltage of about +1 V is applied to a selected word line WLm, and a voltage of the ground level is applied to the other, non-selected word lines WLa–WLl and WLn–WLz. A voltage of about +12 V is applied to a selected bit line BLm, and a voltage of ground level is applied to the other, non-selected bit lines BLa–BL1 and BLn–BLz. Consequently, the electric potential of the floating gate FG is pulled up by the capacitive coupling between the source S and the floating gate FG, thus producing a high electric field between the control gate CG and the floating gate FG. Thus, the electrons in the channel CH are accelerated to become hot electrons which are supplied to the floating gate FG. As a result, a charge is stored in the floating gate FG of the selected memory cell 101 and 1-bit of data is written.

It is noted that each memory cell 101 has a threshold voltage Vth of +0.5 V and includes a transistor, which includes a control gate CG, source S and drain D. Therefore, electrons in the source S are moved in the channel CH in the weakly inverted state from P to N, so that the cell current flows to the drain D from the source S.

(c) Read Mode

In read mode, a voltage of about +4 V is applied to a selected word line WLm, and the voltage of the ground level is applied to the other, non-selected word lines WLa–WL1 and WLn–WLz. A voltage of about +3 V is applied to a selected bit line BLm and the voltage of the ground level is applied to the other, non-selected bit lines BLa–BL1 and BLn–BLz. As a result, the cell current which flows to the source S of the memory cell 101 in the erased state from the drain D becomes greater than the cell current flowing in the memory cell 101 in the write state. This is because the channel CH directly below the floating gate FG of the data-erased memory cell is enabled, while the channel CH directly below the floating gate FG of the data-written memory cell is disabled in the memory cell in the write state.

More specifically, because electrons are drained from the floating gate FG of a data-erased memory cell, the floating gate FG is positively charged. Therefore, the channel CH or the memory cell is enabled so that a current flows. As electrons are supplied into the floating gate FG of a data-written memory cell, the floating gate FG is negatively charged. The channel CH or memory cell is thus disabled so that a current does not flow. A NMOS split gate type memory cell is used as the memory cell 101. A PMOS split gate type memory cell may be used as the memory cell 101. In this case, the channel CH or memory cell is disabled so that a current does not flow when the floating gate FG has a high electric potential, and the channel CH or the memory cell is enabled so that a current flows when the floating gate FG has a low electric potential.

Each sense amplifier in the sense amplifier group 130 discriminates the level of the cell current flowing in the associated memory cell as erase data "1" or write data "0". In this manner, binary data having a data value "1" indicating the erased state and a data value "0" indicating the written state may be stored in each memory cell.

International Patent Publication WO92/18980 discloses a flash EEPROM in which the source S of the split gate memory cell 101 is identified as a "drain" and the drain D is identified as a "source". FIG. 4 shows voltages applied to a selected word line, a selected bit line, the common source line and the substrate in the individual operation modes of this flash EEPROM.

In the above two types of flash EEPROMs, multi-value data can be stored in any memory cell 101 by adjusting the value of the cell current Id which flows in the memory cell. As shown in FIG. 5, the electric potential Vfg of the floating gate FG (hereinafter referred to as "floating gate potential") is the electric potential of the floating gate FG with respect to the electric potential of the source S, and is given by the following equation:

$$Vfg = Vfgw + Vfgc$$

where Vfgw is the electric potential produced by a charge stored in the floating gate FG in write mode and Vfgc is the potential produced by the capacitive coupling with the drain D. In read mode, the electric potential Vfgc is constant so that the cell current value Id is specifically determined by the electric potential Vfgw. In write mode, the amount of charge in the floating gate FG or the electric potential Vfgw is controlled by adjusting the write operation time. The control on the floating gate potential Vfg permits the cell current value Id in read mode to be set at an arbitrary value.

Suppose that a data value "00" is associated with a cell current value Id which is less than 20 $\mu$A, a data value "01" is associated with a cell current value Id which is equal to or greater than 20 $\mu$A and less than 50 $\mu$A, a data value "10" is associated with a cell current value Id which is equal to or greater than 50 $\mu$A and less than 80 $\mu$A, and a data value "11" is associated with a cell current value Id which is equal to or greater than 80 $\mu$A. In this case, the write operation time is controlled so that individual floating gate potentials Va, Vb and Vc corresponding to the individual cell current values Id (20 $\mu$A, 50 $\mu$A and 80 $\mu$A) are acquired in write mode. In this manner, four-value (2-bit) data is stored in a single memory cell.

In read mode, when the floating gate potential Vfg is smaller than the threshold voltage Vth (+0.5 V), the cell current value Id is 0. When the floating gate potential Vfg exceeds the threshold voltage Vth, the cell current value Id increases. When the floating gate potential Vfg exceeds +3.5 V, the cell current value Id is saturated due to the constant resistance of the channel CH which lies directly below the control gate CG. That is, the channel CH serves as a constant resistor because a constant voltage (+4 V) is applied to the control gate CG. Therefore, a series connection of the transistor to the constant resistor of the channel CH is present in the memory cell. When the floating gate potential Vfg is less than a given value (+3.5 V), as apparent from the above, the cell current value Id varies in accordance with the characteristic of the transistor.

To ensure that data is written accurately, it is important to precisely control the floating gate voltage of each memory cell in the write mode. In other words, it is important to control the voltage applied to the floating gate to high precision to ensure that the floating gate will have a desired electric potential after a write operation.

Japanese Unexamined Patent Publication No. 4-57294 discloses a write verification technique for multi-value storage modes to ensure high-precision control of the floating gate voltage. The write verification technique first performs writing to memory cells for a given time (e.g., several hundred nanoseconds to several microseconds), and then performs a verify read operation. Then, the data value to be written is compared with the data value that has been read. When the data values do not match, writing is once again executed for a given time. In this manner, the write operation, the verify read operation and the comparison are repeated until the read and write data values coincide. The write verification method is however disadvantageous for fast data writing for at least the following reasons.

(1) It takes time to perform verify read operations and comparison operations, and such operations do not directly contribute to writing data in memory cells. More specifically, the transition from the write mode to the verify read mode requires a predetermined time (e.g., several microseconds) to switch from the write bias conditions to the appropriate read bias conditions. In addition, a total of approximately 100 to 300 nsec are needed for the verify read operation and the comparing operation.

(2) To control the electric potential of the floating gate more precisely, the number of repetitions of a cycle (i.e., the write operation, verify read operation and comparing operation) is increased, thus unfortunately increasing the overall time needed for the write operation. Higher precision control is achieved by suppressing the amount of a change in the electric potential of the floating gate in a single write operation. It is thus necessary to repeat the cycle while shortening the time needed for a single write operation.

(3) Since the timing control for switching the individual operations in the cycle from one to another is delicate and complex, a semiconductor memory device control circuit is complex and chip area therefore is increased.

The present invention relates to a semiconductor memory device which writes data in memory cells very fast while precisely controlling data writing in the memory cells.

SUMMARY OF THE INVENTION

Briefly stated, the present invention provides a semiconductor memory device including a memory cell array, a control circuit and a write data determining circuit. The memory cell array has a plurality of memory cells each including a control gate electrode, a source, a drain and a floating gate electrode. A data value of a memory cell is determined in accordance with an amount of charge stored in the floating gate electrode. The control circuit controls voltages applied to the control gate electrode, the source and the drain of at least one memory cell such that a charge which is greater than a charge amount corresponding to a desired data value is stored in the floating gate electrode first, and then drained therefrom in a data write mode. The write data determining circuit checks an amount of charge remaining in the floating gate electrode after stored charge in the floating gate electrode is drained, and disables a write operation on at least one memory cell when the amount of charge remaining in the floating gate electrode reaches the charge amount corresponding to the desired data value.

The present invention provides a semiconductor memory device including a memory cell array, a plurality of reference memory cells, a control circuit, first and second comparators and a decoder. The memory cell array has a plurality of memory cells each including a control gate electrode, a source, a drain and a floating gate electrode. The floating gate electrode is capacitively coupled to the control gate electrode and one of the source and the drain and serves to store a charge. A data value of the memory cell is determined in accordance with an amount of charge stored in the floating gate electrode. The plurality of reference memory cells have substantially the same dimension and formed in a same step as the plurality of memory cells of the memory cell array. A control circuit controls voltages applied to the control gate electrode, the source and the drain of at least one memory cell such that a charge greater than a charge amount corresponding to a desired data value is stored in the floating gate electrode first, and then drained therefrom, and controls voltages applied to a control gate electrode, a source and a drain of each reference memory cell such that a charge whose amount corresponds to a threshold value for determining a data value is stored in a floating gate electrode of each reference memory cell. The first comparator compares an amount of the charge remaining in the floating gate electrode of the at least one memory cell with an amount of the charge stored in the floating gate electrode of each reference memory cell and outputs a comparison result. The decoder produces a data value currently written in the at least one memory cell based on the comparison result. The second comparator compares the data value produced by the decoder with the desired data value, and outputs a signal for disabling a write operation on the at least one memory cell when the decoder data value and the desired data value substantially coincide with each other.

The present invention provides a method of writing data in a semiconductor memory device including the steps of: providing a memory cell array having a plurality of memory cells each including a control gate electrode, a source, a drain and a floating gate electrode, the floating gate electrode being capacitively coupled to the control gate electrode and one of the source and the drain and serving to store a charge, a data value being determined in accordance with an amount of a charge stored in the floating gate electrode; storing a charge whose amount is greater than a charge amount corresponding to a desired data value in the floating gate electrode by controlling voltages applied to the control gate electrode, the source and the drain of at least one memory cell; draining a charge from the floating gate electrode by controlling voltages applied to the control gate electrode, the source and the drain of the at least one memory cell; checking an amount of a charge remaining in the floating gate electrode of the at least one memory cell resulting from draining of a charge from the floating gate electrode thereof; and disabling a write operation on the at least one memory cell when the amount of a charge remaining in the floating gate electrode reaches the charge amount corresponding to the desired write data value.

The present invention provides a method of writing data in a semiconductor memory device including the steps of: providing a memory cell array having a plurality of memory cells each including a control gate electrode, a source, a drain and a floating gate electrode, the floating gate electrode being capacitively coupled to the control gate electrode and one of the source and the drain and serving to store a charge, a data value thereof being determined in accordance with an amount of the charge stored in the floating gate electrode; providing a plurality of reference memory cells having substantially the same dimensions as the memory cells of the memory cell array and being formed in a same step as the memory cells of the memory cell array; storing a charge whose amount is greater than a charge amount corresponding to a desired data value by controlling voltages applied to the control gate electrode, the source and the drain of at least one memory cell; draining a charge from the floating gate electrode by controlling voltages applied to the control gate electrode, the source and the drain of the at least one memory cell; storing a charge whose amount corresponds to a threshold value for determining a data value in a floating gate electrode of each reference memory cell by controlling voltages applied to a control gate electrode, a source and a drain of each reference memory cell; comparing an amount of a charge remaining in the floating gate electrode of the at least one memory cell with an amount of a charge stored in the floating gate electrode of each reference memory cell and generating a comparison result; producing a data value currently written in the at least one memory cell based on the comparison result; and comparing the produced data value with the desired data value, and disabling a write operation on the at least one memory cell when the desired data value substantially coincides the produced data value.

The present invention can be implemented in numerous ways including as an apparatus and a method.

Other aspects and advantages of the invention will become apparent from the following description, taken in conjunction with the accompanying drawings, illustrating by way of example the principals of the invention.

BRIEF DESCRIPTION OF THE DRAWINGS

The invention, together with objects and advantages thereof, may best be understood by reference to the following description of the presently preferred embodiments together with the accompanying drawings in which:

FIG. 3 is a chart showing operational conditions of the flash EEPROM of FIG. 2;

FIG. 4 is a chart showing operational conditions of another flash EEPROM;

FIG. 8 is a chart showing operational conditions of the flash EEPROM of FIG. 6:

FIG. 18 is a chart of operational conditions of the flash EEPROM of FIG. 15.

DETAILED DESCRIPTION OF THE PREFERRED EMBODIMENTS

Figure 1:
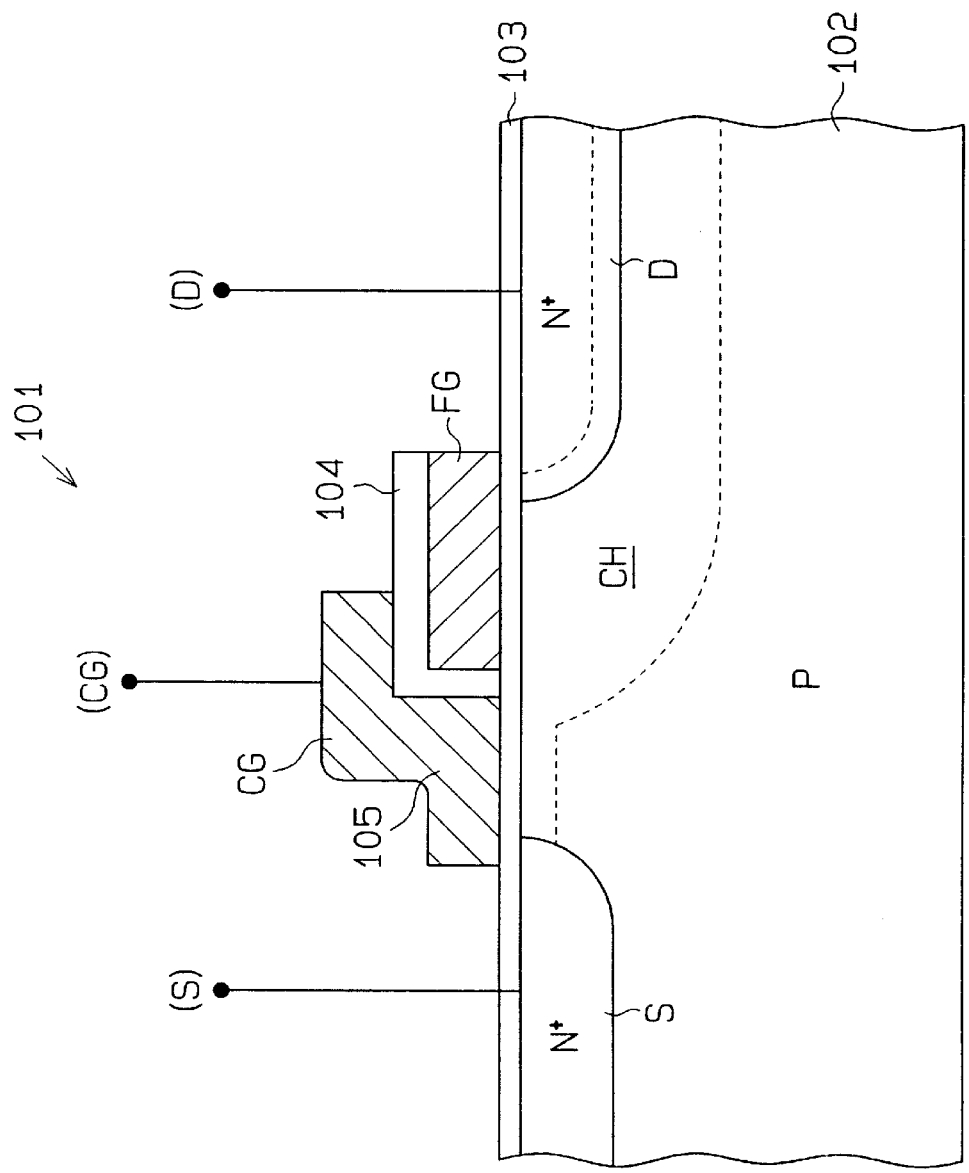
FIG. 1 is a schematic cross-sectional view of a prior art split gate memory cell.
Figure 2:
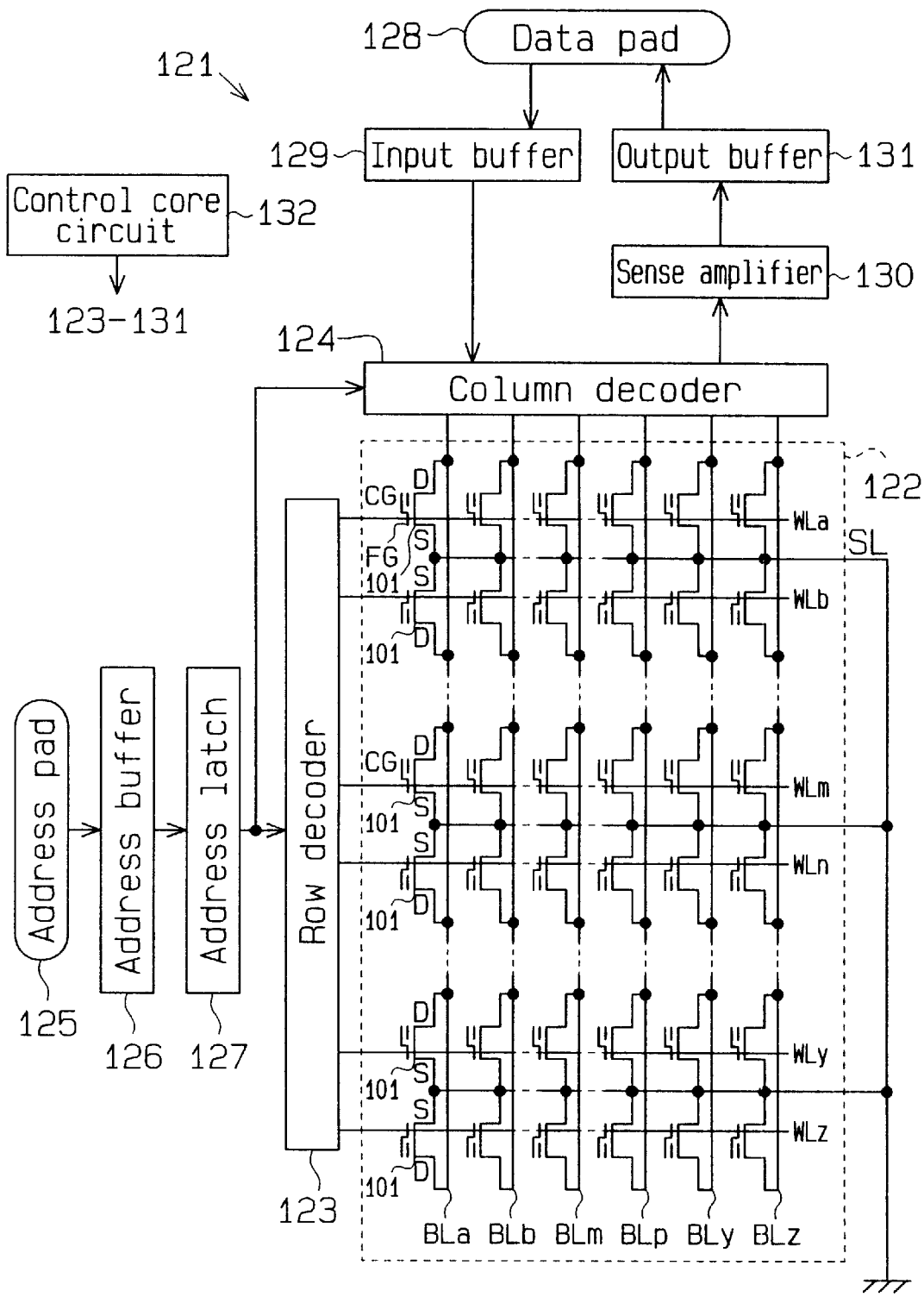
FIG. 2 is a schematic block diagram of a prior art flash EEPROM having split gate memory cells of FIG. 1.
Figure 5:
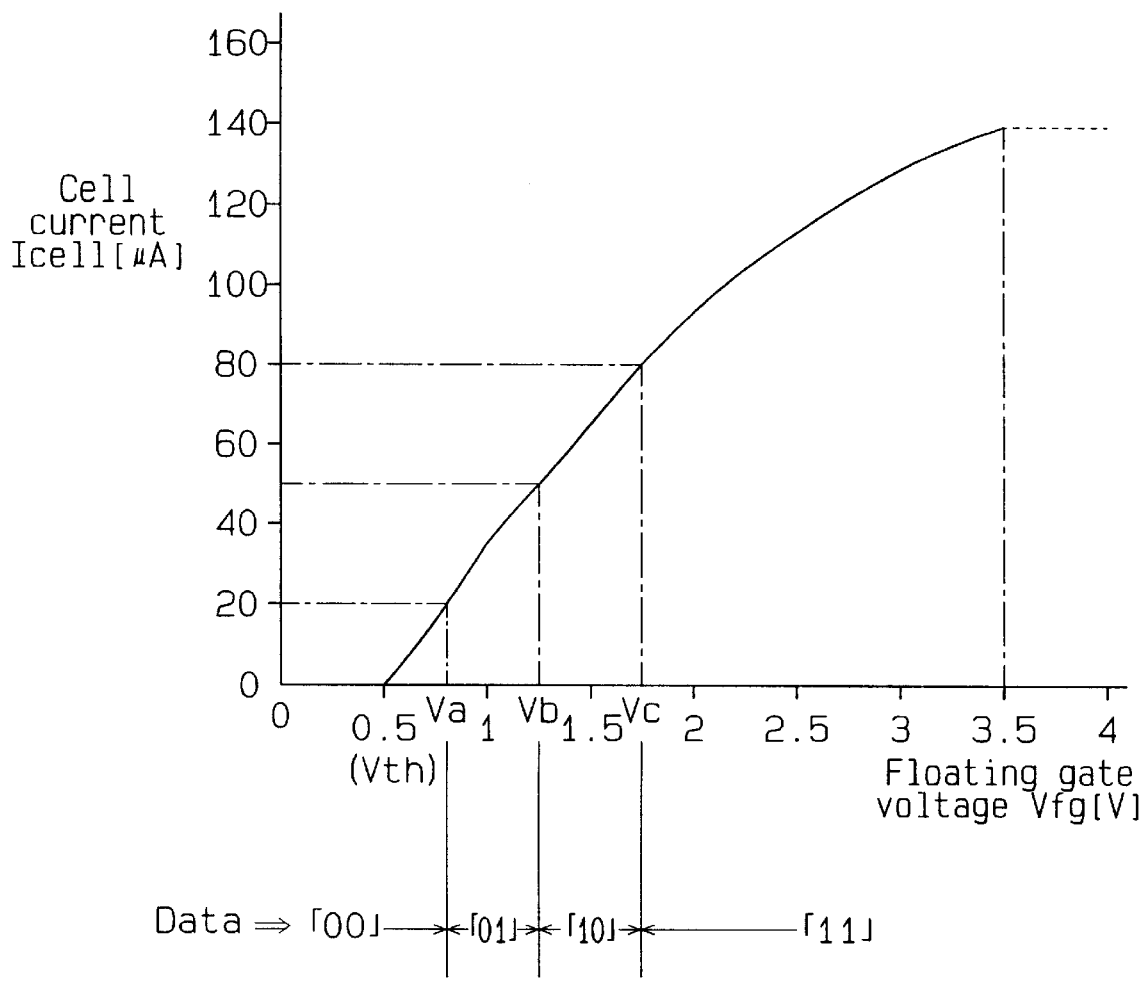
FIG. 5 is a graph depicting a relationship between the floating gate voltage of a prior art memory cell and the current which flows in the prior art memory cell.
Figure 6:
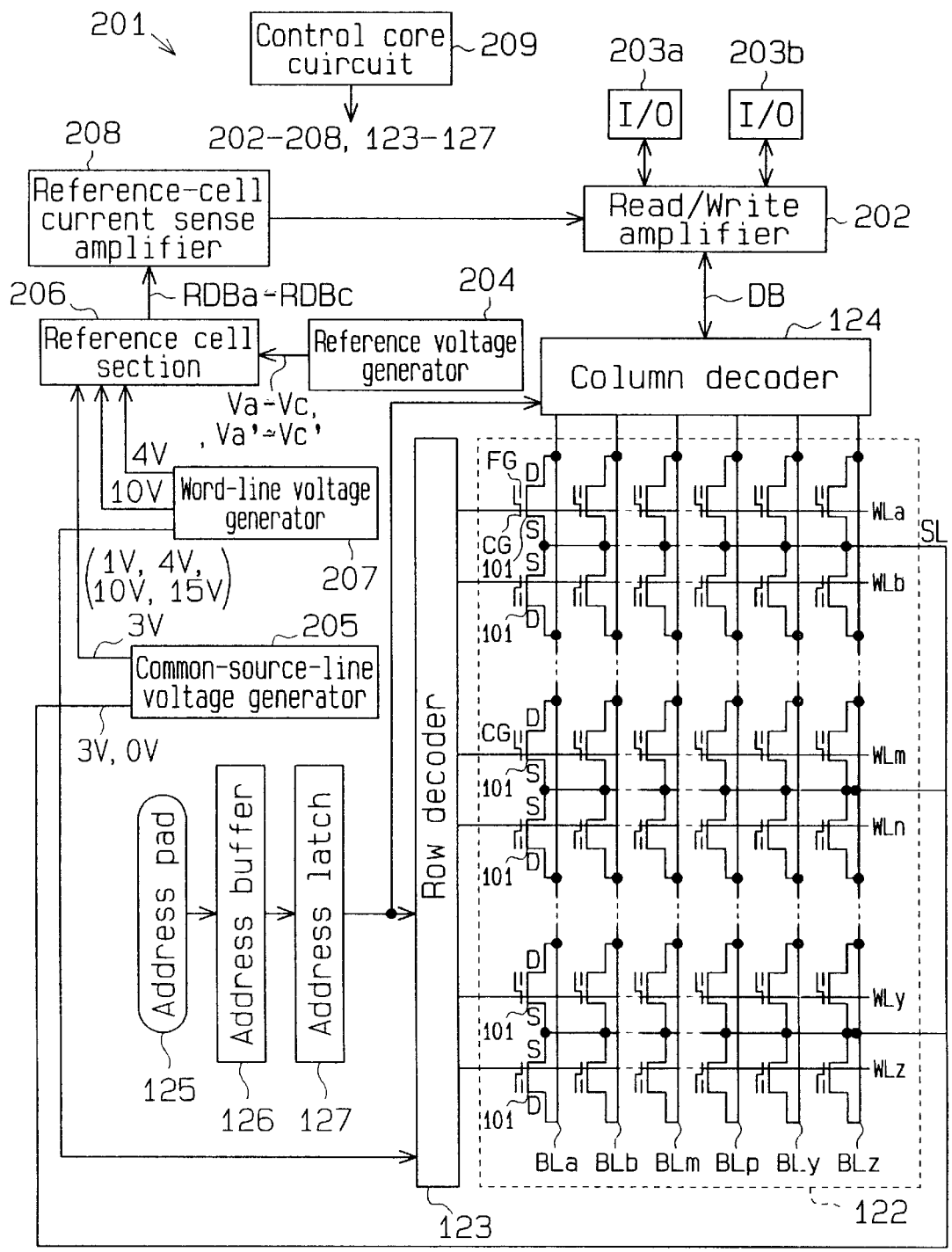
FIG. 6 is a schematic block diagram of a flash EEPROM according to a first embodiment of the present invention.

In the drawings, like numerals indicate like elements throughout. FIG. 6 is a schematic block diagram of a flash EEPROM 201 having a plurality of memory cells 101 according to a first embodiment of the present invention, each capable of storing four-state (2-bit) data. The flash EEPROM 201 comprises a read/write amplifier 202 connected via a data bus DB to a column decoder 124, two data pads 203a and 203b connected to the read/write amplifier 202, a reference voltage generator 204, a reference cell section 206, a word-line voltage generator 207, a reference-cell current sense amplifier 208 and a control core circuit 209.

The upper bit of the 2-bit input data is supplied to the read/write amplifier 202 via the data pad 203a, and the lower bit is supplied via the data pad 203b. The read/write amplifier 202 sends the 2-bit input data to the column decoder 124 via the data bus DB. The column decoder 124 selects one of the bit lines BLa to BLz in accordance with a column address latched by an address latch 127, and connects the selected bit line to the data bus DB.

Two bits of read data read from a selected one of the memory cells 101 is transferred to the read/write amplifier 202 via the selected one of the bit lines BLa–BLz, the column decoder 124 and the data bus DB. The read/write amplifier 202 generates 2-bit output data from the read data, and sends the upper bit to the data pad 203a and the lower bit to the data pad 203b.

The reference voltage generator 204 supplies a constant reference voltage (Va, Vb, Vc, Va', Vb', Vc') to the reference cell section 206. A common-source-line voltage generator 205, connected to a common source line SL, controls the voltage (preferably about 3 V or about 0 V) applied to the common source line SL in accordance with various operation modes illustrated in FIG. 8, and provides the reference cell section 206 with a constant source voltage. The word-line voltage generator 207 controls a voltage to be applied to word lines WLa to WLz, and supplies two values of constant voltages (preferably about 4 V and about 10 V) to the reference cell section 206.

The reference cell section 206 is connected to the reference-cell current sense amplifier 208 via reference data buses RDBa to RDBc. The output of the reference-cell current sense amplifier 208 is sent to the read/write amplifier 202. The control core circuit 209 controls the operations of the individual circuits 202–208 and 123–127.

Figure 7:
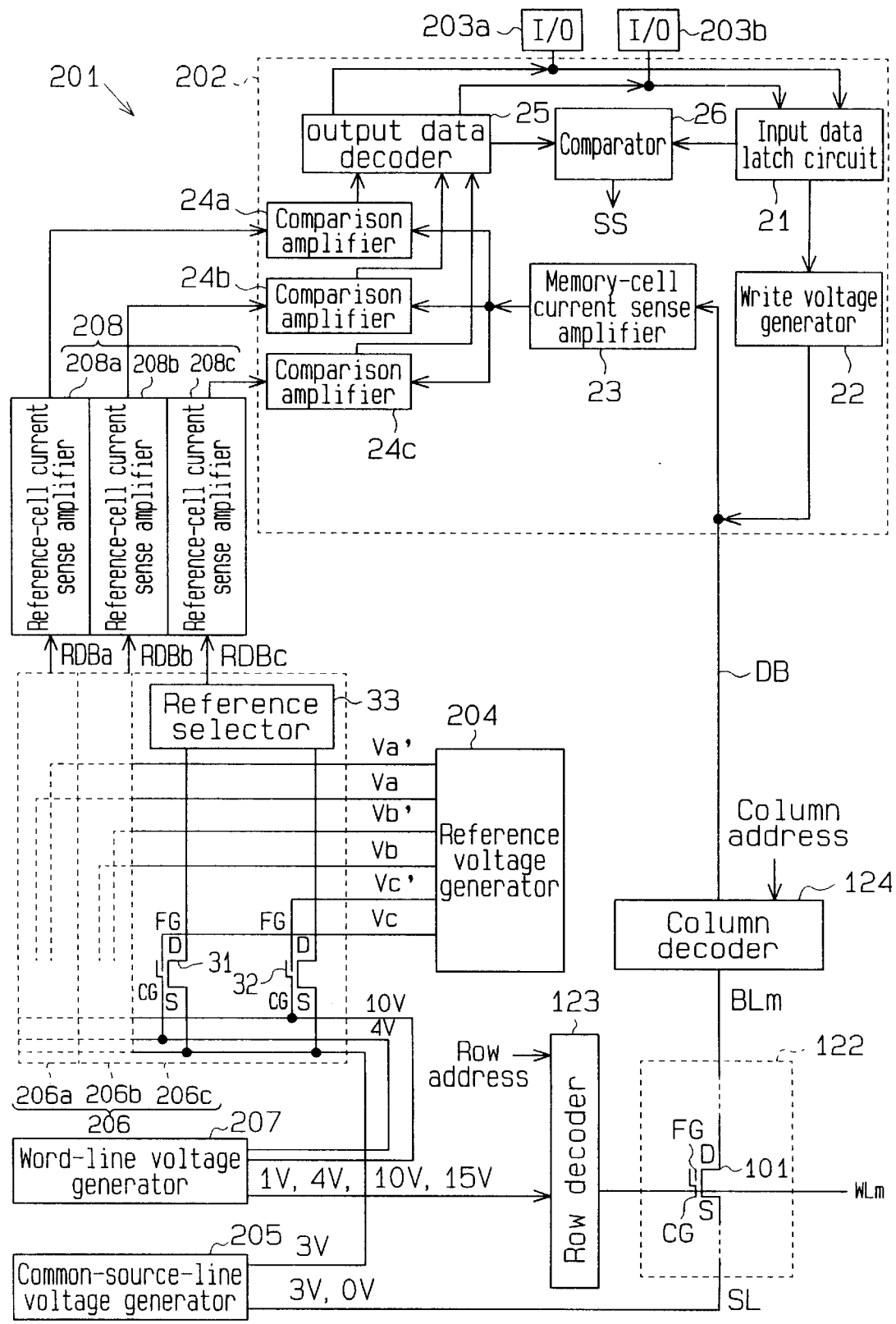
FIG. 7 is a more detailed block diagram of the flash EEPROM of FIG. 6.

As shown in FIG. 7, the reference cell section 206 includes three reference cell blocks 206a to 206c. Each of the reference cell blocks 206a–206c has a read reference cell 31, an erase/read reference cell 32, and a reference selector 33. The reference cells 31 and 32 are preferably formed in the same dimension in the same step as each memory cell 101, and are preferably laid out or located proximate to a memory cell array 122.

The constant voltage (3 V) supplied from the common-source-line voltage generator 205 is applied to the source region S of each reference cell 31 or 32. The constant voltage (4 V) from the word-line voltage generator 207 is applied to the control gate electrode CG of the read reference cell 31. The constant voltage (10 V) from the word-line voltage generator 207 is applied to the control gate electrode CG of the erase/read reference cell 32.

The constant voltage from the reference voltage generator 204 is applied to the floating gate electrode FG of each reference cell 31 or 32. More specifically, in the reference cell block 206a, the voltage Va (0.75 V) is applied to the floating gate electrode FG of the read reference cell 31, and the voltage Va' (0.6 V) is applied to the floating gate electrode FG of the erase/read reference cell 32. In the reference cell block 206b, the voltage Vb (1.25 V) is applied to the floating gate electrode FG of the read reference cell 31, and the voltage Vb' (1 V) is applied to the floating gate electrode FG of the erase/read reference cell 32. In the reference cell block 206c, the voltage Vc (1.75 V) is applied to the floating gate electrode FG of the read reference cell 31, and the voltage Vc' (1.5 V) is applied to the floating gate electrode FG of the erase/read reference cell 32. The voltage Vb' is set to an intermediate value between the voltage Va and the voltage Vb, and the voltage Vc' is set to an intermediate value between the voltage Vb and the voltage Vc. The voltage Va' is set to a voltage of 0.1 V plus a threshold voltage Vth (0.5 V) of a transistor which is formed by the floating gate electrode FG, the source region S and the drain region D of the memory cell 101.

The reference selector 33 of the reference cell block 206a selects the read reference cell 31 in read mode and selects the erase/read reference cell 32 in erase/read mode, and connects the drain region D of the selected reference cell 31 or 32 to the reference data bus RDBa. The reference selector 33 of the reference cell block 206b connects the drain region D of the selected reference cell 31 or 32 to the reference data bus RDBb. The reference selector 33 of the reference cell block 206c connects the drain region D of the selected reference cell 31 or 32 to the reference data bus RDBc.

The reference-cell current sense amplifier 208 includes three reference-cell current sense amplifiers 208a to 208c. The reference-cell current sense amplifier 208a controls a voltage to be applied to the drain region D of each reference cell 31 or 32 in the reference cell block 206a and converts the cell current which flows through each reference cell 31, 32 to a voltage in the read operation and erase/read operation. The reference-cell current sense amplifier 208b performs the same operation on the associated reference cell block 206b as done by the reference-cell current sense amplifier 208a. The reference-cell current sense amplifier 208c performs the same operation on the associated reference cell block 206c as done by the reference-cell current sense amplifier 208a.

The output voltages of the individual reference-cell current sense amplifiers 208a–208c are sent to the read/write amplifier 202. The read/write amplifier 202 includes an input data latch circuit 21, a write voltage generator 22, a memory-cell current sense amplifier 23, comparison amplifiers 24a to 24c, an output data decoder 25 and a comparator 26.

The input data latch circuit 21 latches input data transferred from each of data pads 203a or 203b. The write voltage generator 22 generates a write voltage Vpp associated with the input data latched in the input data latch circuit 21 and supplies the write voltage Vpp to the data bus DB in the write operation.

The memory-cell current sense amplifier 23 controls a voltage applied to the drain region D of the selected memory cell 101 and converts the cell current which flows through the memory cell 101 to a voltage in the read operation and erase/read operation.

The comparison amplifiers 24a–24c compare the output voltage of the memory-cell current sense amplifier 23 with the output voltages of the associated reference-cell current sense amplifiers 208a–208c.

The output data decoder 25 produces output data in accordance with the comparison results of the comparison amplifiers 24a–24c and transfers the output data to the associated data pads 203a and 203b. The comparator 26 compares the input data latched in the input data latch circuit 21 with the output data generated by the output data decoder 25, and generates an erase/read operation disable signal SS in accordance with the comparison result.

The individual operation modes of the flash EEPROM 201 (the erase operation, read operation, write operation and erase/read operation) will now be described. In each of the operation modes, a voltage of the ground level is applied to a substrate 102 of the flash EEPROM 201.

(a) Erase Operation

A description will now be given of a case where the word line WLm is selected by the row decoder 123 and data stored in all of the memory cells 101 connected to the word line WLm are erased.

The voltages of all of the bit lines BLa–BLz are clamped to 0 V. As a result, the voltages of the drain regions D of all of the memory cells 101 are clamped to 0 V.

A voltage of 15 V is applied to the control gate electrodes CG of the individual memory cells 101 connected to the word line WLm, and 0 V is applied to the control gate electrodes CG of the individual memory cells 101 that are connected to the other, non-selected word lines WLa–WL1 and WLn–WLz. A voltage of 0 V is applied to the source regions S of all of the memory cells 101 connected to the common source line SL. Consequently, all of the memory cells 101 that are connected to the selected word line WLm are erased.

(b) Read Operation

A description will be given below of a case where data is read from the memory cell 101 connected to the intersection of the word line WLm and the bit line BLm.

A voltage of 4 V is applied to the control gate electrodes CG of the individual memory cells 101 connected to the word line WLm, and 0 V is applied to the control gate electrodes CG of the individual memory cells 101 connected to the non-selected word lines WLa–WL1 and WLn–WLz. A voltage of 0 V is applied to the drain regions D of the individual memory cells 101 connected to the selected bit line BLm, and 3 V is applied to the drain regions D of the individual memory cells 101 that are connected to the non-selected bit lines BLa–BL1 and BLn–BLz. A voltage of 3 V is applied to the source regions S of all of the memory cells 101 connected to the common source line SL. As a result, a cell current Icell corresponding to a floating gate voltage Vfg flows through the selected memory cell 101. According to the first embodiment, the voltage conditions for the source region S and drain region D of the selected memory cell 101 are opposite to those for the conventional flash EEPROM 121. However, since the cell current Icell is defined by the voltage Vfg of the floating gate electrode FG, a current flows through the memory cell 101 even under the opposite voltage conditions.

Figure 9:
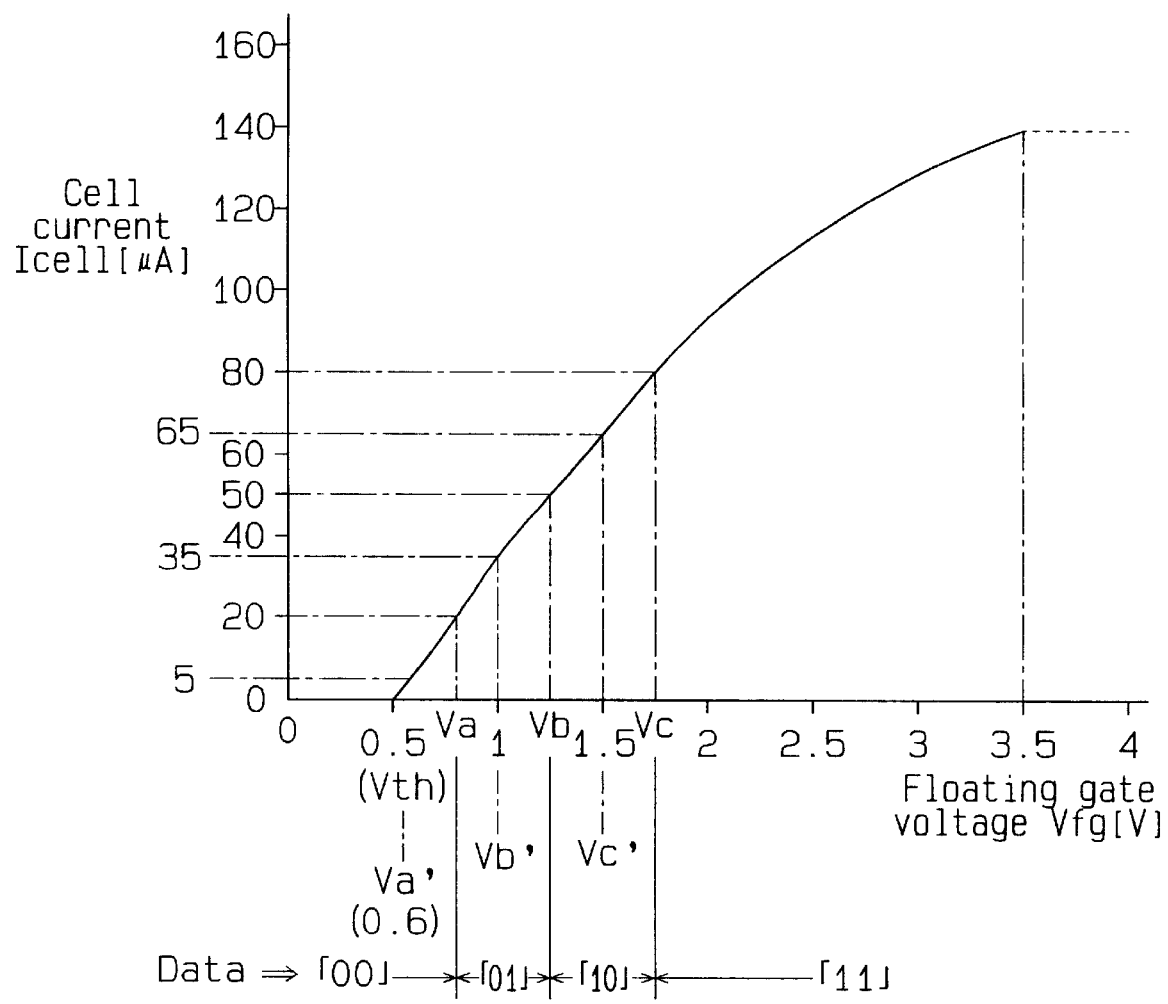
FIG. 9 is a graph illustrating a relationship between the floating gate voltage of a memory cell in accordance with the present invention, which is set in a read operation and a write operation, and the current which flows in the memory cell.

As shown in FIG. 9, as the voltage Va (the floating gate voltage Vfg) is applied to the read reference cell 31 of the reference cell block 206a, the cell current Icell (20 μA) flows through the cell 31. As the voltage Vb (the floating gate voltage Vfg) is applied to the read reference cell 31 of the reference cell block 206b, the cell current Icell (50 μA) flows through the cell 31. Further, as the voltage Vc (the floating gate voltage Vfg) is applied to the read reference cell 31 of the reference cell block 206c, the cell current Icell (80 μA) flows through the cell 31. That is, the cell current flows through each reference cell under the following voltage conditions: the voltages Va, Vb and Vc are respectively applied to the floating gate electrodes FG of the read reference cells 31, the constant voltage (3 V) is applied to the source regions S, a voltage of 0 V is applied to the drain regions D, and the constant voltage (4 V) is applied to the control gate electrodes CG.

Figures 12, 13:
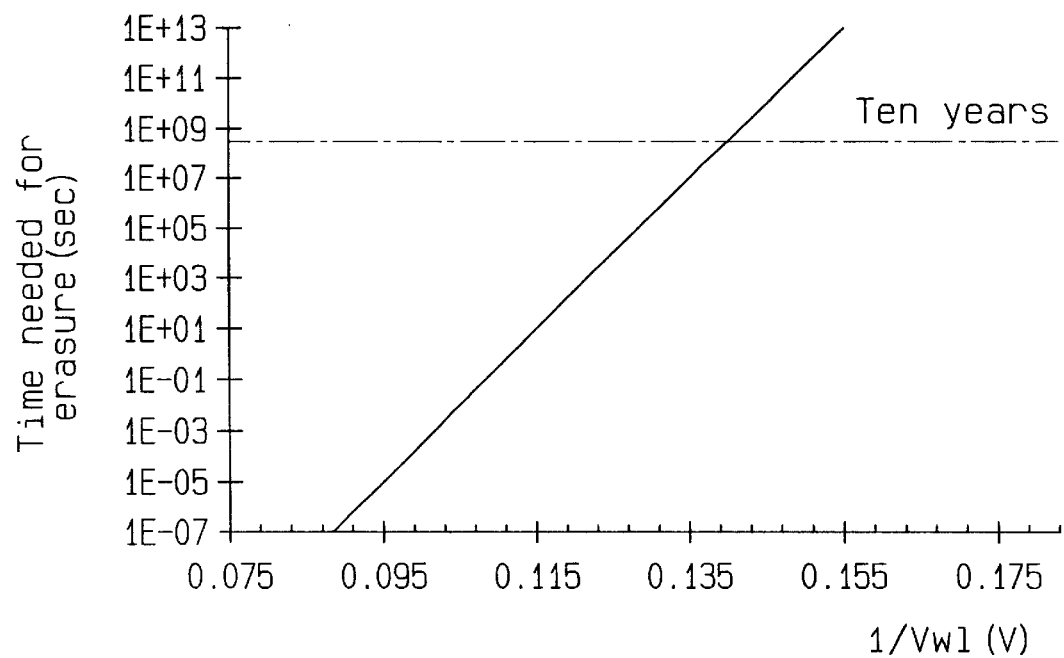
FIG. 12 is a chart showing logical outputs of a memory cell in accordance with the present invention.
FIG. 13 is a graph showing a relationship between a word-line voltage and the time needed to erase data stored in a memory cell.

The comparison amplifiers 24a–24c compare the output voltage (cell current) produced by the memory-cell current sense amplifier 23 with the output voltages (cell currents) produced by the respective reference-cell current sense amplifiers 208a–208c. When the cell current Icell of the selected memory cell 101 is larger than the cell current Icell of the read reference cell 31, the comparison results of the comparison amplifiers 24a–24c are "1", and when the former cell current Icell is smaller than the latter, the comparison results are "0". Based on the comparison results of the comparison amplifiers 24a–24c, the output data decoder 25 performs logic operations as shown in FIG. 12 to produce 2-bit output data.

(c) Write Operation

A description will be given below of a case where data is written in the memory cell 101 connected to the intersection of the word line WLm and the bit line BLm.

A voltage of 1 V is applied to the control gate electrodes CG of the individual memory cells 101 connected to the word line WLm, and 0 V is applied to the control gate electrodes CG of the individual memory cells 101 connected to the non-selected word lines WLa–WL1 and WLn–WLz. A voltage of 0 V is applied to the source regions S of all the memory cells 101 that are connected to the common source line SL.

Figures 10, 11:
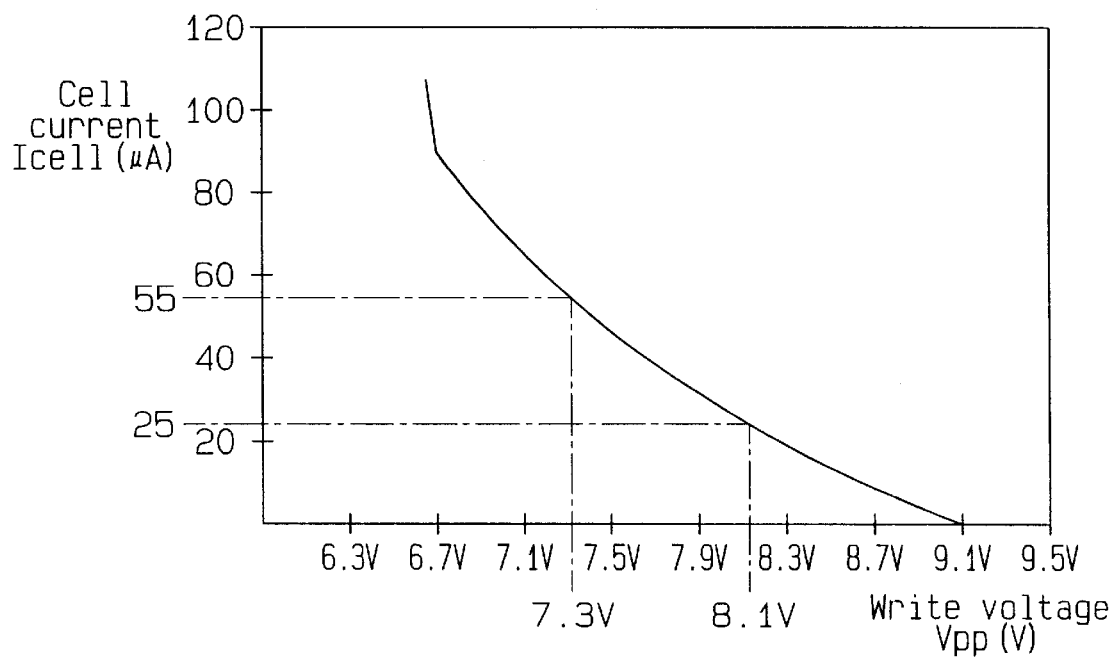
FIG. 10 is a chart showing conditions for setting a write voltage in the write operation of the flash EEPROM of FIG. 6.
FIG. 11 is a graph depicting a relationship between the write voltage and the current, which flows in a memory cell, in the write operation of the flash EEPROM of FIG. 6.

As shown in FIG. 10, the write voltage Vpp corresponding to the input data is applied to the drain regions D of the individual memory cells 101 connected to the bit line BLm, and 0 V is applied to the drain regions D of the individual memory cells 101 connected to the non-selected bit lines BLa–BL1 and BLn–BLz.

It is preferable that the write voltage Vpp is equal to or greater than approximately 7.5 V so that electrons in the channel region CH are accelerated and supplied as hot electrons to the floating gate electrode FG. In other words, electrons in the source region S in the selected memory cell 101 travel into the channel region CH in the inverted state and the potential of the drain region D is set to write voltage Vpp. Then, the voltage of the floating gate electrode FG is pulled up by the electrostatic coupling between the drain region D and the floating gate electrode FG and approaches the write voltage Vpp. Consequently, a high electric field is generated between the control gate electrode CG and the floating gate electrode FG, and a charge is stored in the floating gate electrode FG. The amount of charge stored in the floating gate electrode FG is therefore controllable by adjusting the write voltage Vpp applied to the drain region D.

FIG. 11 is a graph which shows a relationship between the write voltage Vpp and the cell current Icell at a given write time. With the write voltage Vpp ranging from about 6.7 V to about 9 V, the write voltage Vpp corresponds one to one with the cell current Icell. Note, however, that it is difficult to precisely control the cell current Icell merely by adjusting the write voltage Vpp due to variations in the fabrication process of the individual memory cells 101 and the influence of the parasitic capacitances and interconnection resistances that are originated from the physical positions of the memory cells 101.

The present invention ensures accurate writing by carrying out rough writing while setting the write voltage Vpp in the write operation and then by precisely controlling the floating gate voltage Vfg in the erase/read operation.

The write voltage Vpp is set based on the relationship between the cell current Icell and the floating gate voltage Vfg. Specifically, individual cell currents Icell corresponding to voltages lower by a voltage of 0.3 V than the intermediate values (Va', Vb' and Vc') of the floating gate voltage Vfg, and then the write voltages Vpp corresponding to the acquired cell currents Icell are set in accordance with the relationship in FIG. 11. It is ideal to set the floating gate voltage Vfg in the write operation to the intermediate values (Va', Vb' and Vc') of the threshold voltages (Va, Vb and Vc) which are the reference levels in the read operation. According to the embodiment, the floating gate voltage Vfg is set lower than the ideal voltage to increase the write voltage, thereby increasing the amount of charge stored in the floating gate electrode FG. With the amount of charge thus increased, the charge amount or the floating gate voltage Vfg is accurately adjusted in the next erase/read operation.

For instance, the cell current Icell (about 25 $\mu$A) corresponding to the voltage (0.7 V) which is a voltage of 0.3 V subtracted from the intermediate value Vb' (1 V) of the floating gate voltage Vfg in FIG. 9 is acquired. Then, the write voltage Vpp (8.1 V) corresponding to the cell current Icell (about 25 $\mu$A) in FIG. 11 is set. Likewise, the cell current Icell (about 55 $\mu$A) corresponding to the voltage (1.2 V) which is a voltage of 0.3 V subtracted from the intermediate value Vc' (1.5 V) of the floating gate voltage Vfg is acquired. Then, the write voltage Vpp (7.3 V) corresponding to the cell current Icell (about 55 $\mu$A) is set. The cell current Icell (0 $\mu$A) corresponding to the voltage (0.3 V) which is a voltage of 0.3 V subtracted from the intermediate value Va' (0.6 V) of the floating gate voltage Vfg is acquired. Then, the write voltage Vpp (9.5 V) corresponding to the cell current Icell (0 $\mu$A) is set.

(d) Erase/Read Operation

The erase/read operation is subsequently performed on the memory cell 101 selected in the write operation. Preferably, voltage of about 10 V is applied to the control gate electrodes CG of the individual memory cells 101 which are connected to the word line WLm, and 0 V is applied to the control gate electrodes CG of the individual memory cells 101 which are connected to the non-selected word lines WLa–WL1 and WLn–WLz. A voltage of 0 V is applied to the drain regions D of the individual memory cells 101 connected to the bit line BLm, and 3 V is applied to the drain regions D of the individual memory cells 101 connected to the non-selected bit lines BLa–BL1 and BLn–BLz. A voltage of 3 V is applied to the source regions S of all the memory cells 101 that are connected to the common source line SL.

In the erase/read operation, weak erasure is performed only on the selected memory cell 101, and no erasure is performed on the non-selected memory cells 101. Further, as 3 V is applied to the source regions S and drain regions D of the individual memory cells 101 which are connected to the non-selected bit lines BLa–BL1 and BLn–BLz, the cell current Icell does not flow therethrough. The reason for this will be described with reference to FIG. 13, which is a graph showing a relationship between the time needed to erase data stored in a memory cell 101 and a voltage Vwl of the word lines WLa–WLz. As the word-line voltage Vwl associated with the selected memory cell 101 is 10 V (1/Vwl= 0.1), data stored in the memory cell 101 is erased in about two or three hundred seconds. Therefore, relatively weak erasure is performed on the selected memory cell 101.

Because 3 V is applied to the drain regions D of the memory cells 101 that are connected to the intersections of the word line WLm and the non-selected bit lines BLa–BL1 and BLn–BLz, the capacitive coupling between the drain region D and the floating gate electrode FG pulls up the voltage of the floating gate electrode FG to close to 3 V. Accordingly, the voltage difference between the control gate electrode CG (10 V) of each non-selected memory cell 101 and the floating gate electrode FG (3 V) is set to 7 V, and the word-line voltage Vwl is substantially set to 7 V. With the word-line voltage Vwl being 7 V (1/Vwl≈0.14), data stored in each memory cell 101 will not be erased for approximately ten years.

Further, because of the voltage difference of 3 V between the control gate electrode CG and the floating gate electrode FG of each of the memory cells 101 connected to the non-selected word lines WLa–WL1 and WLn–WLz, the word-line voltage Vwl is set to 0 V. Data stored in the memory cells 101 are not erased.

In the reference cell blocks 206a–206c, the voltages Va', Vb' and Vc' are respectively applied to the floating gate electrodes FG of the associated erase/read reference cells 32, a constant voltage (3 V) is applied to the source regions S, 0 V is applied to the drain regions D, and a constant voltage (10 V) is applied to the control gate electrodes CG. Therefore, the cell current Icell (5 μA) corresponding to the voltage Va' (the floating gate voltage Vfg) flows in the erase/read reference cell 32 in the reference cell block 206a. The cell current Icell (35 μA) corresponding to the voltage Vb' (the floating gate voltage Vfg) flows in the erase/read reference cell 32 in the reference cell block 206b. Further, the cell current Icell (65 μA) corresponding to the voltage Vc' (the floating gate voltage Vfg) flows in the erase/read reference cell 32 in the reference cell block 206c.

The comparison amplifiers 24a–24c compare the cell current of the selected memory cell with the cell currents of the respective reference cells, and the output data decoder 25 produces 2-bit output data based on the comparison results. The comparator 26 compares the 2-bit input data latched in the input data latch circuit 21 with the 2-bit output data produced by the output data decoder 25 and enables the erase/read operation disable signal SS when the output data becomes larger than the input data. The control core circuit 209 stops the erase/read operation in accordance with the enabled erase/read operation disable signal SS. Consequently, the floating gate voltage Vfg is accurately set to the voltage Va', Vb' or Vc'. In other words, according to the present invention, in the erase/read operation following the write operation, weak erasure is performed on the selected memory cell 101 and at the same time reading is carried out to detect the cell current Icell. The progress of the erase operation is determined based on the detected cell current Icell, and erasure is terminated when the cell current Icell reaches the desired value. Accordingly, the floating gate voltage Vfg is set to the desired voltage Va', Vb' or Vc' and accurate writing is accomplished. Further, since the present invention does not employ the verify writing system, accurate and fast writing is implemented. Furthermore, the load on the control core circuit 209 is reduced, allowing the structure of the control core circuit 209 to be simplified.

Figure 14:
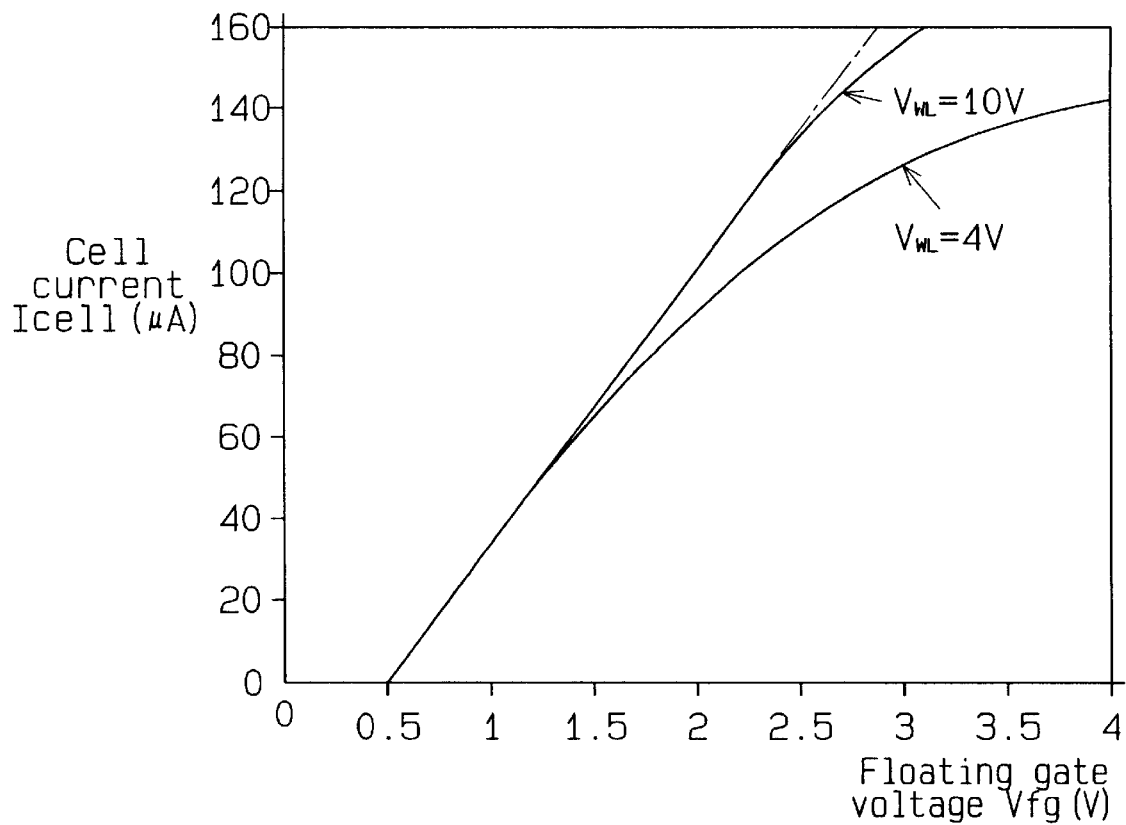
FIG. 14 is a graph depicting a relationship between the floating gate voltage of a memory cell and the current which flows in the memory cell, for different word-line voltages.

FIG. 14 presents a graph depicting a relationship between the floating gate voltage Vfg and the cell current Icell for different word-line voltages Vwl. In the present invention, the range of the floating gate voltage Vfg equal to or lower than 1.75 V (see FIG. 9) is used to store multi-state data. Within this range, the resistant value of the first part of the channel region CH directly below the floating gate electrode FG is greater than the resistant value of the second part of the channel region CH directly below the control gate electrode CG. The relationship between the floating gate voltage Vfg and the cell current Icell is hardly affected by the word-line voltage Vwl. It is thus possible to use the same memory-cell current sense amplifier 23 in both the read operation and the erase/read operation. In other words, the cell current Icell in the read operation and the cell current Icell in the erase/read operation become substantially the same. Further, the same reference-cell current sense amplifiers 208a–208c are used in the read operation as well as in the erase/read operation. That is, the cell current Icell in the read operation and the cell current Icell in the erase/read operation become substantially the same.

Because the voltage Vwl of the selected word line WLm differs between the read operation and the erase/read operation as shown in FIG. 8, an error between the output data in the read operation and the output data in the erase/read operation may be originated from a variation in word-line voltage Vwl. As the relationship between the floating gate voltage Vfg and the cell current Icell is hardly affected by the word-line voltage Vwl, however, the probability of an error in output data caused by the variation in word-line voltage Vwl is significantly decreased.

In the read bias condition in the read operation and the erase/read operation, the voltage of the source region S is higher than the voltage of the drain region D. According to the present invention, however, the source region S and the drain region D in the read operation and the erase/read operation are treated the same as those in the erase operation and the write operation. The common source line SL is also determined on the basis of the erase operation and the write operation.

Figure 15:
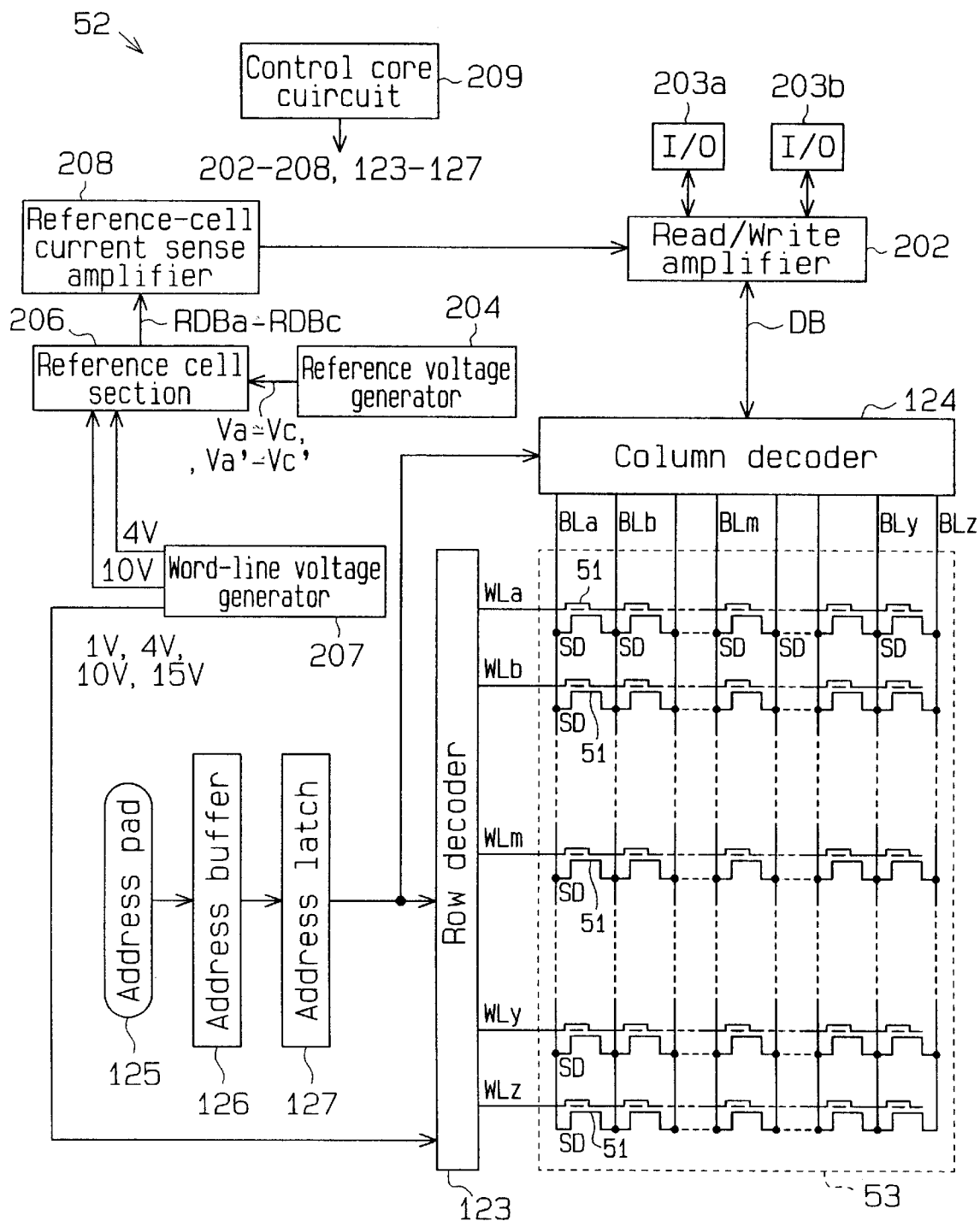
FIG. 15 is a schematic block diagram of a flash EEPROM according to a second embodiment of the present invention.

FIG. 15 is a schematic block diagram of a flash EEPROM 52 according to the second embodiment of the present invention. The flash EEPROM 52 of the second embodiment has a virtually grounded memory cell array 53 as disclosed in U.S. Pat. No. 5,544,103, which is hereby incorporated by reference in its entirety. The memory cell array 53 includes a matrix of split gate memory cells 51 each of which stores 4-state (2-bit) data. The control gate electrodes CG of individual rows of the memory cells 51 are respectively formed by common word lines WLa to WLz. The source/drain regions SD of individual columns of the memory cells 51 form common bit lines BLa to BLz. The memory cell array 53 does not include the common-source-line voltage generator 205.

Figure 16:
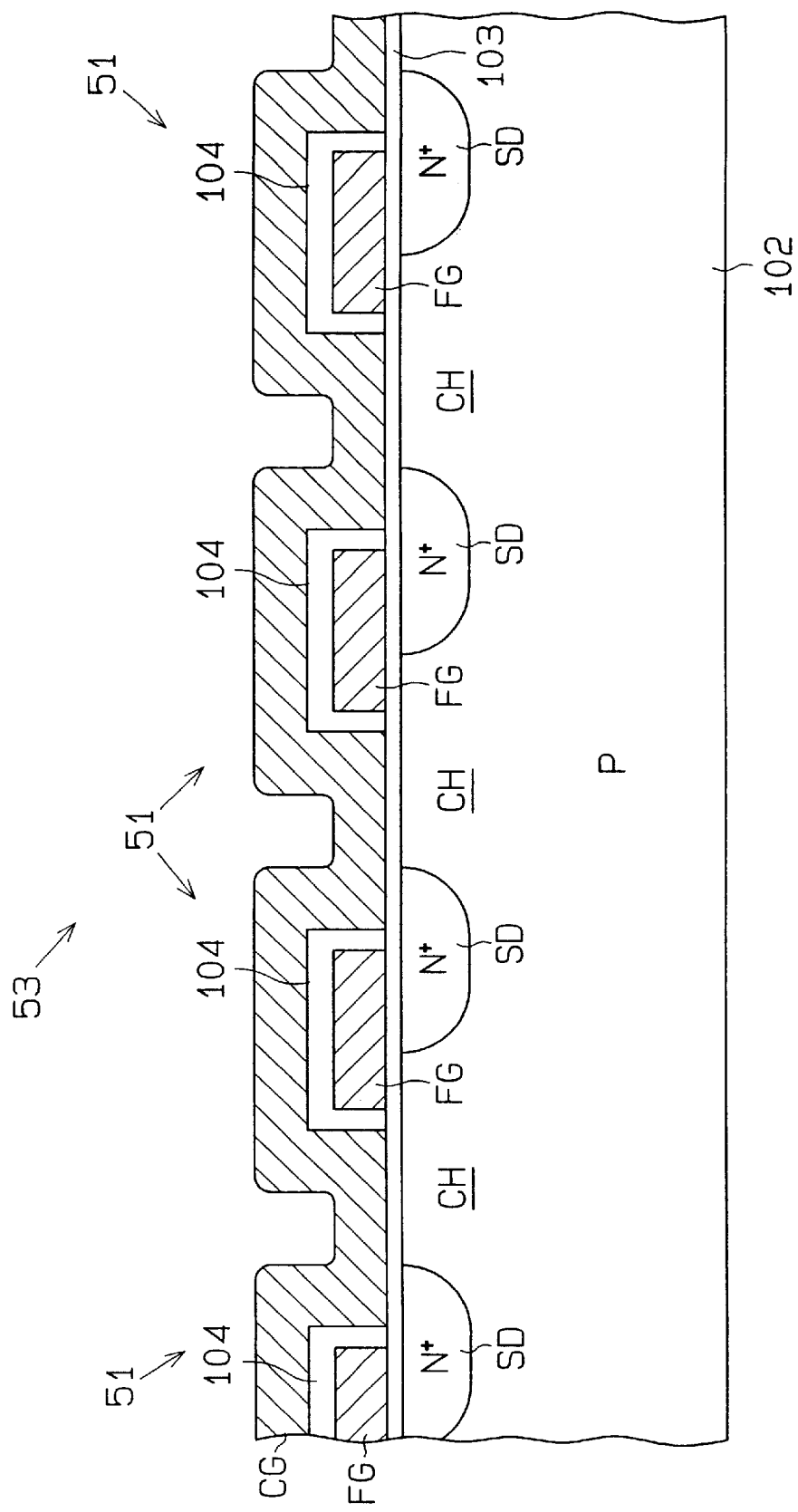
FIG. 16 is a schematic cross-section view of memory cells of the flash EEPROM of FIG. 15.

FIG. 16 is a schematic cross-section view of the memory cell array 53. Each memory cell 51 includes an N type source/drain region SD, a floating gate electrode FG, a control gate electrode CG, a channel region CH and a select gate 105.

The N type source/drain region SD is defined in the surface of a P type single crystalline silicon substrate 102. The channel region CH is defined between the adjoining source/drain regions SD on the silicon substrate 102. Deposited on the silicon substrate 102 is a first silicon oxide film 103 on which the floating gate electrode FG is located above a part of the channel region CH and a part of the source/drain region SD. A second silicon oxide film 104 is deposited on the floating gate electrode FG, and the control gate electrode CG is provided on the first and second silicon oxide films 103 and 104. A part of the control gate electrode CG is located above the channel region CH, forming the select gate 105. The control gate electrodes CG of the memory cells 51 laid out in a row direction forms a common word line.

Figure 17:
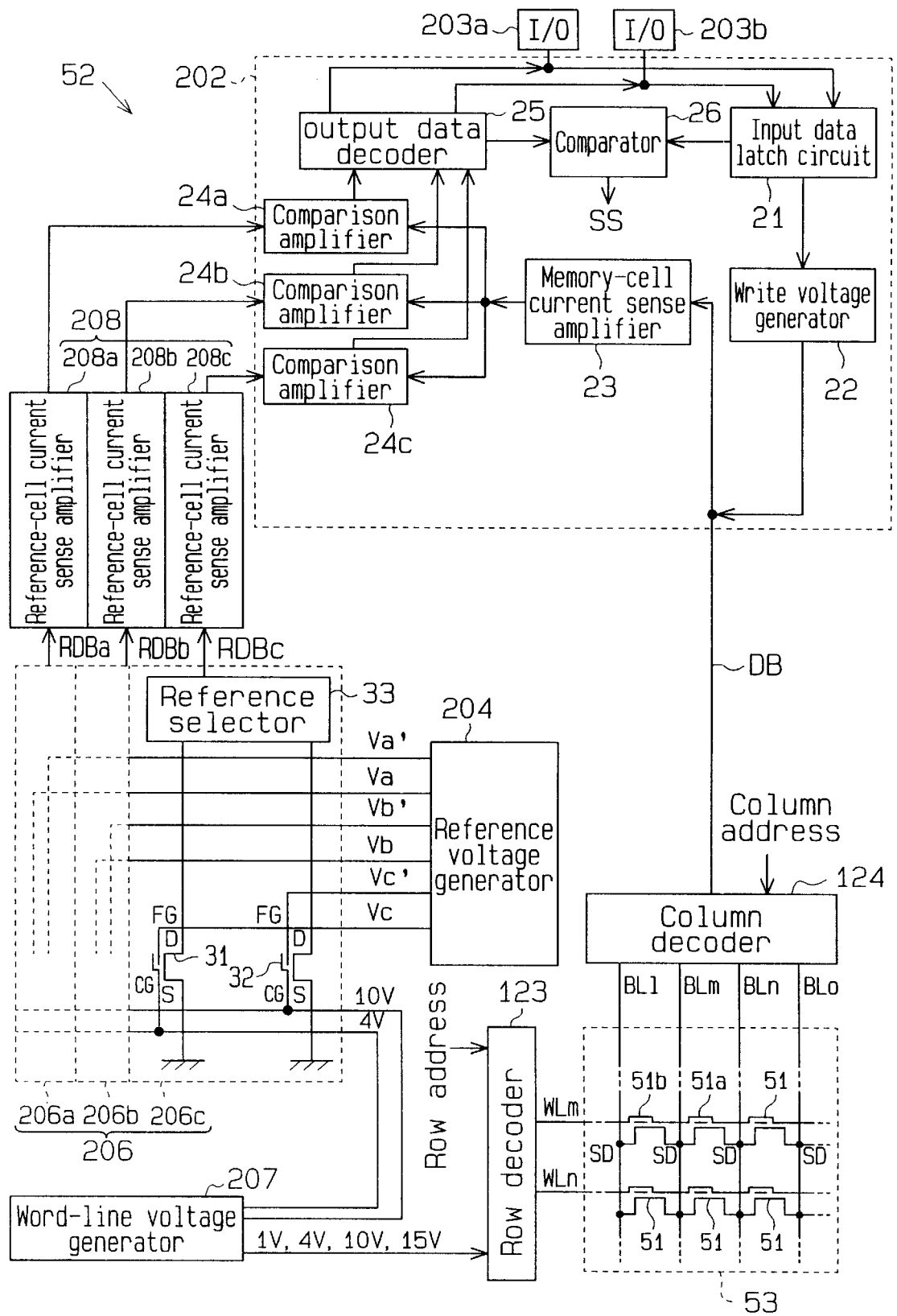
FIG. 17 is a more detailed block diagram of the flash EEPROM of FIG. 15.

FIG. 17 presents a detailed block diagram of the flash EEPROM 52 of the second embodiment. The flash EEPROM 52 differs from the flash EEPROM 201 in that the source regions S of the reference cells 31 and 32 are grounded. The individual operation modes of the flash EEPROM 52 (the erase operation, read operation, write operation and erase/read operation) will now be discussed with reference to FIG. 18. The source region S and drain region D of each memory cell 101 are the source/drain region SD of the memory cell 51 in the flash EEPROM 52. The erase operation (a), write operation (c) and erase/read operation (d) in the embodiment are the same as those of the first embodiment.

(b) Read Operation

A description will now be given of a case where data is read from a memory cell 51a which is connected to the intersection of the word line WLm and the bit line BLm. Through the same read operation as that of the flash EEPROM 201, the cell current Icell corresponding to the floating gate voltage Vfg flows in the selected memory cell 51a, so that 2-bit data stored in the single memory cell 51a is read out. As 3 V is applied to the two source/drain regions SD of the non-selected memory cell 51, no cell current Icell flows there.

Because the bit lines BLm and BL1 associated with the memory cells 51a and 51b are biased to 0 V by the column decoder 124, the cell current Icell corresponding to the floating gate voltage Vfg flows. As the bit line BL1 is not connected to the data bus DB, however, no data is read from the memory cell 51b.

It should be apparent to those skilled in the art that the present invention may be embodied in many other specific forms without departing from the spirit or scope of the invention. Particularly, it should be understood that the invention may be embodied in the following forms.

(1) Four sets of read/write amplifiers 202, data pads 203a and 203b and data buses DB may be provided, so that the read operation, write operation and erase/read operation may be simultaneously performed on, for example, four memory cells 101 or 51 which are connected to the intersections of the word line WLm and the individual bit lines BLm–BLp. The operation permits data of a total of eight bits to be simultaneously read from and written in the four memory cells 101 or 51, two bits to each memory cell. In this case, it is preferable to apply 3 V to any of the bit lines BLa–BLz which is connected to the memory cells 101 or 51 whose erase/read operation has been completed, as well as the non-selected ones of the bit lines BLa–BLz.

(2) A high voltage may be applied to the bit lines BLa–BLz, so that the write operation which is performed most on the memory cells is treated as an "erase operation" and the erase/read operation is treated as a "write operation." That is, as many charge as possible is stored in the floating gate of the selected memory cell in the "erase operation" and the charge stored in the floating gate is drained so that the amount of the remaining charge becomes the optimal value corresponding to data to be written. In this case, the "erase operation" should preferably be executed for each selected memory cell 101, 51.

(3) The present invention may be adapted to a stacked gate flash EEPROM.

(4) The present invention may be adapted to non-volatile semiconductor memories including Ferro-electric RAM, EPROM and EEPROM, and semiconductor memories such as DRAM and SRAM.

Therefore, the present examples and embodiments are to be considered as illustrative and not restrictive and the invention is not to be limited to the details given herein, but may be modified within the scope and equivalence of the appended claims.

What is claimed is:

1. A semiconductor memory device comprising:
a memory cell array having a plurality of memory cells each including a control gate electrode, a source, a drain and a floating gate electrode, wherein a data value of a memory cell is determined in accordance with an amount of charge stored in the floating gate electrode;
a control circuit for controlling voltages applied to the control gate electrode, the source and the drain of at least one memory cell such that a charge which is greater than a charge amount corresponding to a desired data value is stored in the floating gate electrode first, and then drained therefrom in a data write mode; and
a write data determining circuit for checking an amount of charge remaining in the floating gate electrode after stored charge in the floating gate electrode is drained, and disabling a write operation on at least one memory cell when the amount of charge remaining in the floating gate electrode reaches the charge amount corresponding to the desired data value.

2. The semiconductor memory device according to claim 1, wherein a cell current flowing in each memory cell varies in accordance with an amount of the charge stored in its floating gate electrode, and the write data determining circuit includes a sense amplifier for detecting the cell current flowing in at least one memory cell, the sense amplifier being shared in a write mode and a read mode.

3. The semiconductor memory device according to claim 1, wherein draining of charge from the floating gate electrode by the control circuit and checking of an amount of charge remaining in the floating gate electrode by the write data determining circuit are executed in parallel.

4. The semiconductor memory device according to claim 1, wherein in a write mode, the control circuit applies to the source and the drain a same voltage as applied in a read mode, and applies to the control gate electrode a voltage higher than the read mode applied voltage.

5. The semiconductor memory device according to claim 1, wherein a cell current flowing in each memory cell varies in accordance with an amount of charge stored in the floating gate electrode, and individual values of multi-state data respectively correspond to predetermined ranges of the cell current; and
the write data determining circuit detects in which predetermined range the cell current flowing in at least one memory cell is within and disables the write operation on the at least one memory cell when the cell current is within in a range corresponding to a desired value of multi-state data.

6. The semiconductor memory device according to claim 1, wherein the memory cell array includes a virtually grounded memory cell array.

7. A semiconductor memory device comprising:
a memory cell array having a plurality of memory cells each including a control gate electrode, a source, a drain and a floating gate electrode, the floating gate electrode being capacitively coupled to the control gate electrode and one of the source and the drain and serving to store a charge, wherein a data value of the memory cell is determined in accordance with an amount of charge stored in the floating gate electrode;
a plurality of reference memory cells having substantially the same dimension as the plurality of memory cells of the memory cell array;
a control circuit for controlling voltages applied to the control gate electrode, the source and the drain of at least one memory cell such that a charge greater than a charge amount corresponding to a desired data value is stored in the floating gate electrode first, and then drained therefrom, and controlling voltages applied to a control gate electrode, a source and a drain of each reference memory cell such that a charge whose amount corresponds to a threshold value for determining a data value is stored in a floating gate electrode of each reference memory cell;
a first comparator for comparing an amount of the charge remaining in the floating gate electrode of the at least one memory cell with an amount of the charge stored in the floating gate electrode of each reference memory cell and outputting a comparison result;

a decoder for producing a data value stored in the at least one memory cell based on the comparison result; and a second comparator for comparing the data value produced by the decoder with the desired data value, and outputting a signal for disabling a write operation on the at least one memory cell when the decoder data value and the desired data value substantially coincide with each other.

8. The semiconductor memory device according to claim 7, wherein a cell current flowing in each memory cell varies in accordance with an amount of charge stored in its floating gate electrode, and the semiconductor memory device further includes a sense amplifier for detecting the cell current flowing in the at least one memory cell, the sense amplifier being shared in a write mode and a read mode.

9. The semiconductor memory device according to claim 7, wherein draining of charge from the floating gate electrode by the control circuit and operations of the first and second comparator and the decoder are executed in parallel.

10. The semiconductor memory device according to claim 7, wherein in a write mode, the control circuit applies to the source and the drain of at least one memory cell a same voltage as applied in a read mode, and applies to the control gate electrode of the at least one memory cell a voltage higher than the read mode voltage.

11. The semiconductor memory device according to claim 7, wherein cell currents flowing in each memory cell and each reference memory cell vary in accordance with an amount of charge stored in the floating gate electrode; and the semiconductor memory device further comprises:

a first sense amplifier for detecting a current flowing in at least one memory cell; and a first group of sense amplifiers for detecting currents flowing in individual reference memory cells.

12. The semiconductor memory device according to claim 7, wherein the memory cell array includes a virtually grounded memory cell array.

13. A method of writing data in a semiconductor memory device comprising the steps of:

providing a memory cell array having a plurality of memory cells each including a control gate electrode, a source, a drain and a floating gate electrode, the floating gate electrode being capacitively coupled to the control gate electrode and one of the source and the drain and serving to store a charge, a data value being determined in accordance with an amount of a charge stored in the floating gate electrode;

storing a charge whose amount is greater than a charge amount corresponding to a desired data value in the floating gate electrode by controlling voltages applied to the control gate electrode, the source and the drain of at least one memory cell;

draining a charge from the floating gate electrode by controlling voltages applied to the control gate electrode, the source and the drain of the at least one memory cell;

checking an amount of a charge remaining in the floating gate electrode of the at least one memory cell resulting from draining of a charge from the floating gate electrode thereof; and disabling a write operation on the at least one memory cell when the amount of a charge remaining in the floating gate electrode reaches the charge amount corresponding to the desired write data value.

14. The data writing method according to claim 13, wherein the step of draining of a charge from the floating gate electrode and the step of checking the amount of a charge remaining in the floating gate electrode are carried out in parallel.

15. The data writing method according to claim 13, wherein a cell current flowing in each memory cell varies in accordance with an amount of charge stored in the floating gate electrode of the memory cell, individual values of multi-state data respectively corresponding to predetermined ranges of the cell current;

the step of checking the amount of a charge remaining in the floating gate electrode includes a step of detecting in which predetermined range the cell current flowing in the at least one memory cell lies; and the step of disabling a write operation on the at least one memory cell includes a step of disabling the write operation on the at least one memory cell when the cell current lies in a range corresponding to a desired multi-state data value.

16. A method of writing data in a semiconductor memory device comprising the steps of:

providing a memory cell array having a plurality of memory cells each including a control gate electrode, a source, a drain and a floating gate electrode, the floating gate electrode being capacitively coupled to the control gate electrode and one of the source and the drain and serving to store a charge, a data value thereof being determined in accordance with an amount of the charge stored in the floating gate electrode;

providing a plurality of reference memory cells having substantially the same dimensions as the memory cells of the memory cell array and being formed in a same step as the memory cells of the memory cell array;

storing a charge whose amount is greater than a charge amount corresponding to a desired data value by controlling voltages applied to the control gate electrode, the source and the drain of at least one memory cell;

draining a charge from the floating gate electrode by controlling voltages applied to the control gate electrode, the source and the drain of the at least one memory cell;

storing a charge whose amount corresponds to a threshold value for determining a data value in a floating gate electrode of each reference memory cell by controlling voltages applied to a control gate electrode, a source and a drain of each reference memory cell;

comparing an amount of a charge remaining in the floating gate electrode of the at least one memory cell with an amount of a charge stored in the floating gate electrode of each reference memory cell and generating a comparison result;

producing a data value currently written in the at least one memory cell based on the comparison result; and comparing the produced data value with the desired data value, and disabling a write operation on the at least one memory cell when the desired data value substantially coincides the produced data value.

17. The data writing method according to claim 16, wherein the step of draining of a charge from the floating gate electrode, the step of comparing the amount of a charge in the floating gate electrode, the step of producing a data value and the step of disabling a write operation are carried out in parallel with each other.

18. The data writing method according to claim 16, wherein a cell current flowing in each memory cell varies in accordance with an amount of charge stored in the floating gate electrode thereof, individual values of multi-state data respectively corresponding to predetermined ranges of the cell current;

the step of comparing the amount of a charge in the floating gate electrode includes a step of detecting in which predetermined range the cell current flowing in the at least one memory cell lies by comparing the cell current with a cell current flowing in each reference memory cell; and the step of disabling a write operation includes a step of disabling the write operation on the at least one memory cell when the cell current lies in a range corresponding to a desired value of multi-state data.

* * * * *